(12) United States Patent
Matsushima

(10) Patent No.: US 10,524,357 B2
(45) Date of Patent: Dec. 31, 2019

(54) METHOD FOR PRODUCING FLEXIBLE MOUNTING MODULE BODY

(71) Applicant: DEXERIALS CORPORATION, Tokyo (JP)

(72) Inventor: Takayuki Matsushima, Tokyo (JP)

(73) Assignee: DEXERIALS CORPORATION, Tokyo (JP)

(*) Notice: Subject to any disclaimer, the term of this patent is extended or adjusted under 35 U.S.C. 154(b) by 94 days.

(21) Appl. No.: 15/711,548

(22) Filed: Sep. 21, 2017

(65) Prior Publication Data

US 2018/0020537 A1    Jan. 18, 2018

Related U.S. Application Data

(63) Continuation of application No. PCT/JP2016/059831, filed on Mar. 28, 2016.

(30) Foreign Application Priority Data

Mar. 26, 2015 (JP) ................... 2015-065261

(51) Int. Cl.
*H05K 3/32* (2006.01)
*H05K 1/02* (2006.01)

(52) U.S. Cl.
CPC ............ *H05K 1/028* (2013.01); *H05K 3/32* (2013.01); *H01L 2224/73204* (2013.01); *H01L 2224/83192* (2013.01)

(58) Field of Classification Search
CPC .......... H05K 3/32; H05K 3/301; H05K 3/303; H05K 3/321–3494; H05K 13/046–0469;
(Continued)

(56) References Cited

U.S. PATENT DOCUMENTS 5,273,805 A * 12/1993 Calhoun ................. C09J 7/401
428/156
6,335,563 B1 * 1/2002 Hashimoto ......... H01L 23/4985
257/632
(Continued)

FOREIGN PATENT DOCUMENTS

JP      H04-091447 A    3/1992
JP      H09-092683 A    4/1997
(Continued)

OTHER PUBLICATIONS

Jun. 7, 2016 Search Report issued in Internation Patent Application No. PCT/JP2016/059831.
(Continued)

*Primary Examiner* — Peter Dungba Vo
*Assistant Examiner* — Kaying Kue
(74) *Attorney, Agent, or Firm* — Oliff PLC

(57) ABSTRACT

A method for producing a flexible mounting substrate. The method comprises preparing a flexible substrate having a mounting region for mounting an electronic component on an arrangement surface of the flexible substrate, the electronic component including at least one bump, arranging a thermosetting anisotropic conductive film having conductive particles on the mounting region, arranging the electronic component on the anisotropic conductive film, and pressing the electronic component while heating to electrically connect the at least one bump of the electronic component to the mounting region of the flexible substrate, and adhering an adhesion film having an adhesive layer including an adhesive and a base film laminated together on a support surface that is opposite to the arrangement surface of the flexible substrate at least at a portion located on a back surface side of the mounting region before electrically
(Continued)

connecting the electronic component and the mounting region.

4 Claims, 3 Drawing Sheets

(58) Field of Classification Search
CPC .......... H05K 1/028; H01L 2224/73204; H01L 2224/83192; Y10T 29/49144; Y10T 29/4913–49146; Y10T 29/53174–53183
USPC .......... 29/832–841, 846, 848, 739–741, 429
See application file for complete search history.

(56) References Cited

U.S. PATENT DOCUMENTS

| | | | | |
|---|---|---|---|---|
| 6,498,051 | B1* | 12/2002 | Watanabe | H01L 24/29 257/704 |
| 7,255,919 | B2* | 8/2007 | Sakata | H01L 23/4985 156/329 |
| 10,034,389 | B2* | 7/2018 | Eifuku | H05K 3/341 |
| 2003/0029559 | A1* | 2/2003 | Yamada | C09J 9/00 156/307.7 |
| 2004/0079464 | A1* | 4/2004 | Kumakura | H01L 21/563 156/60 |
| 2007/0215584 | A1* | 9/2007 | Nam | B23K 26/0738 219/121.85 |
| 2009/0288462 | A1* | 11/2009 | Nishimoto | H05K 3/323 72/17.3 |
| 2009/0309220 | A1* | 12/2009 | Katogi | C08G 18/3212 257/741 |
| 2009/0323009 | A1* | 12/2009 | Paek | G02F 1/133305 349/160 |
| 2013/0188324 | A1* | 7/2013 | Lee | H01L 27/1218 361/750 |
| 2014/0205816 | A1* | 7/2014 | Maejima | H01L 21/6836 428/200 |
| 2015/0121692 | A1* | 5/2015 | Eifuku | H01L 24/16 29/840 |
| 2016/0313478 | A1* | 10/2016 | Lee | G02B 5/0242 |
| 2017/0006712 | A1* | 1/2017 | Matsushima | G09F 9/00 |
| 2017/0040306 | A1* | 2/2017 | Kim | H01L 25/167 |

FOREIGN PATENT DOCUMENTS

| | | |
|---|---|---|
| JP | H10-270499 A | 10/1998 |
| JP | 2006-173535 A | 6/2006 |
| JP | 2006-332187 A | 12/2006 |
| JP | 2008-118056 A | 5/2008 |
| JP | 2010-225625 A | 10/2010 |
| JP | 2011-079959 A | 4/2011 |
| JP | 2012-116870 A | 6/2012 |
| JP | 2012-219154 A | 11/2012 |
| WO | 2007/034764 A1 | 3/2007 |

OTHER PUBLICATIONS

Oct. 5, 2017 Preliminary Report on Patentability issued in International Patent Application No. PCT/JP2016/059831.
Sep. 25, 2019 Office Action issued in Japanese Patent Application No. 2016-063659.

* cited by examiner

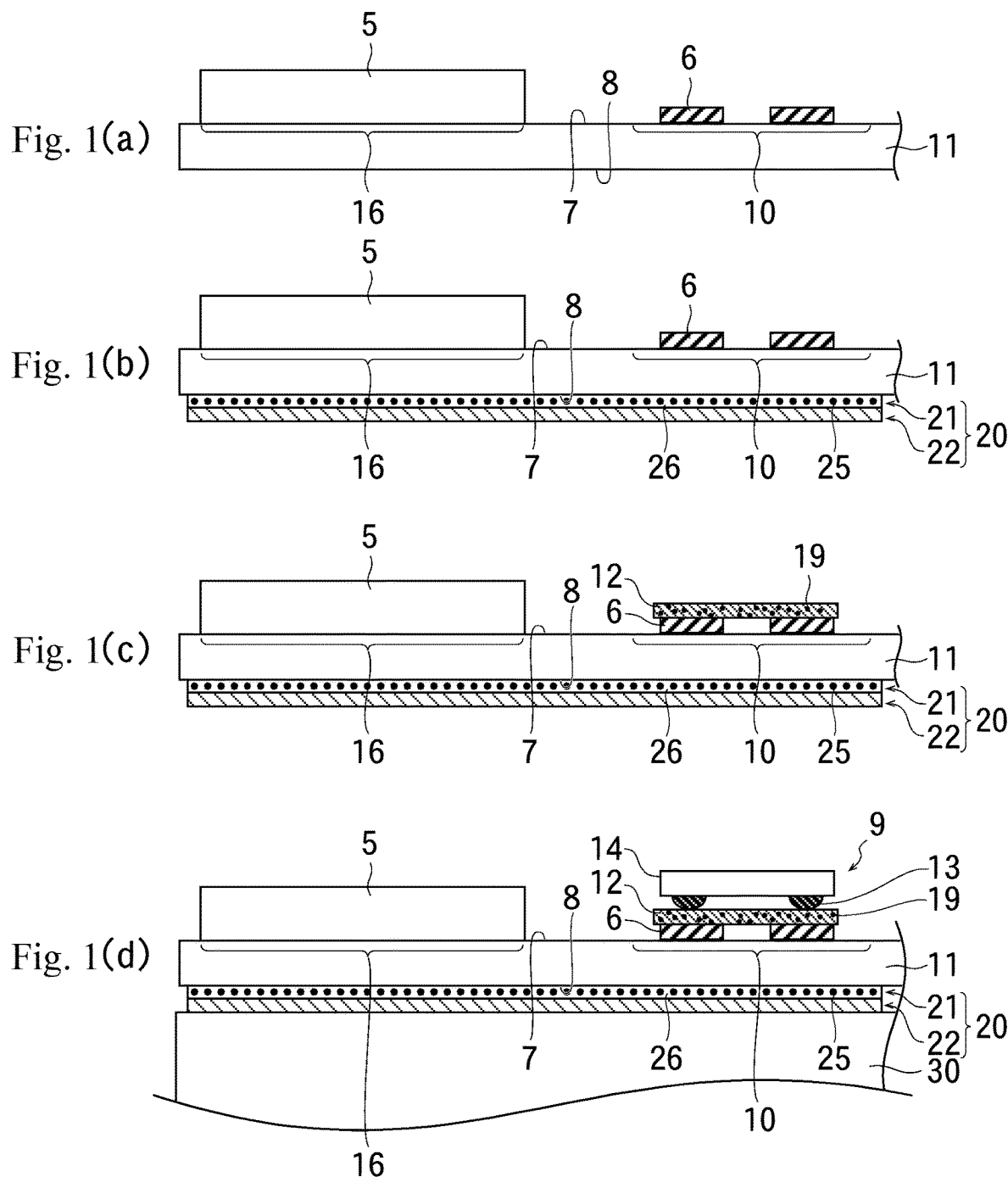

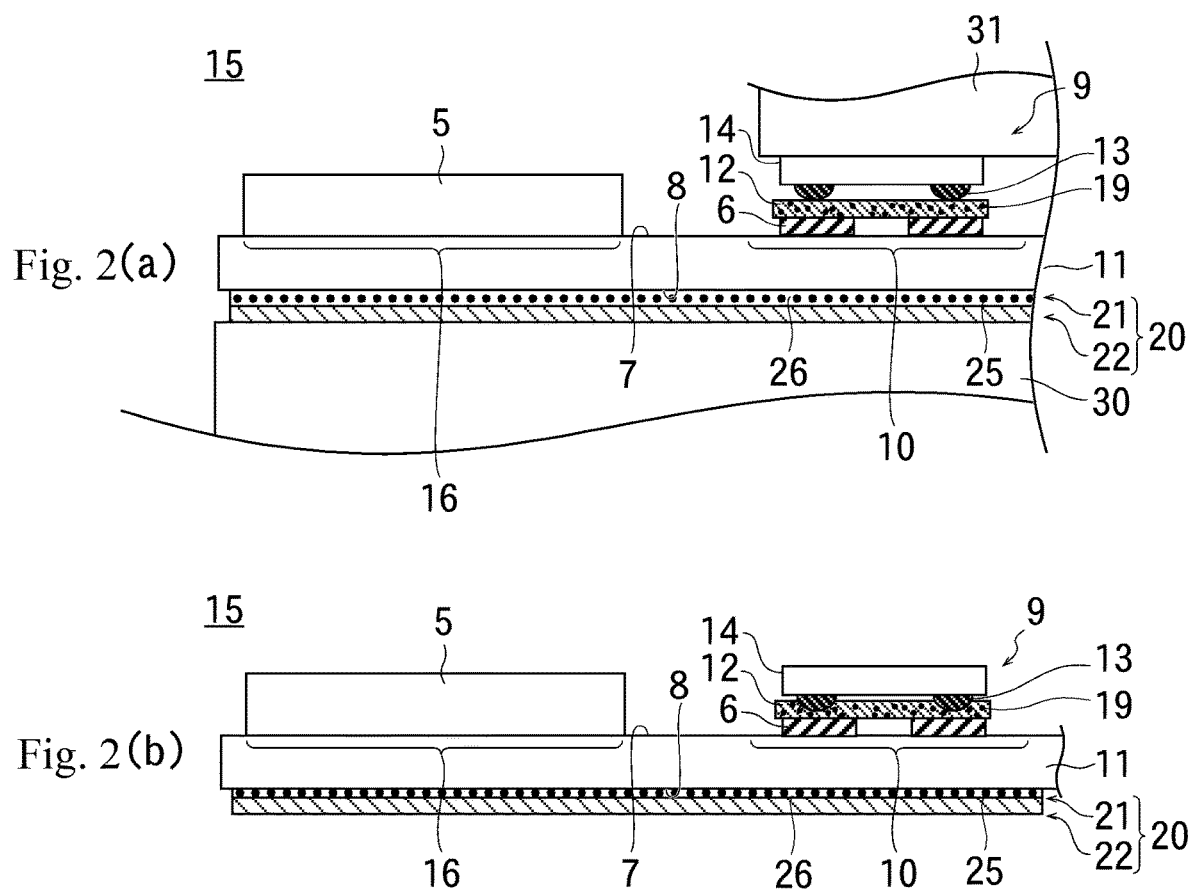

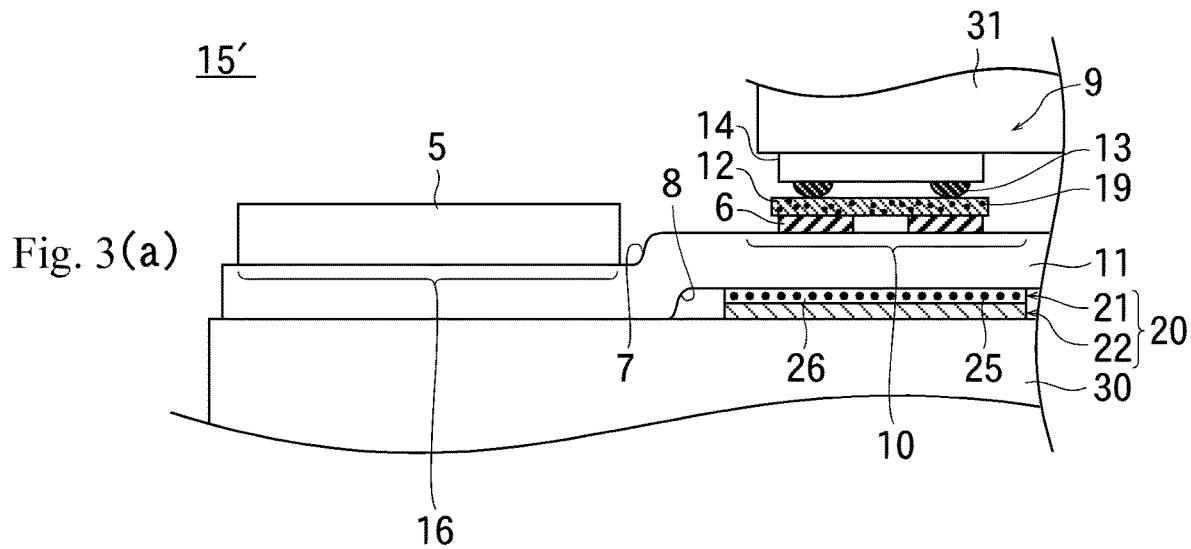
Fig. 3(a)
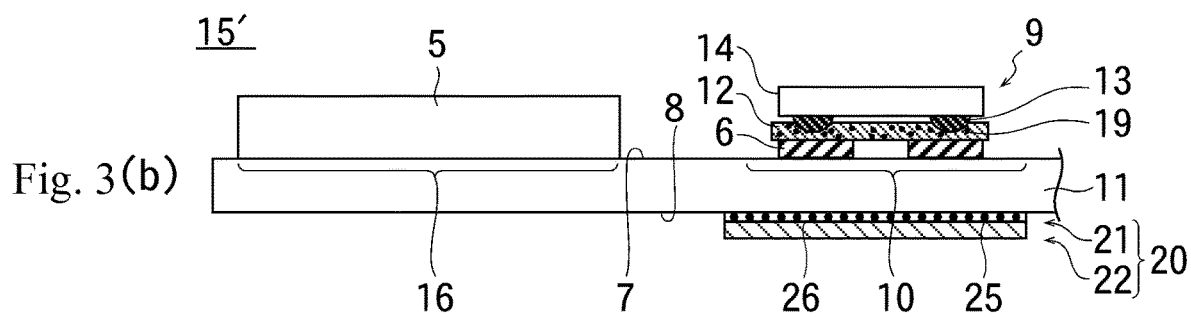
Fig. 3(b)
Fig. 4
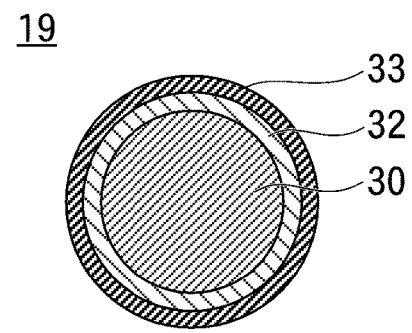

METHOD FOR PRODUCING FLEXIBLE MOUNTING MODULE BODY

This application is a continuation of International Application No. PCT/JP2016/059831, filed on Mar. 28, 2016, which claims priority to Japan Patent Application No. 2015-065261, filed on Mar. 26, 2015. The contents of the prior applications are herein incorporated by reference in their entireties.

TECHNICAL FIELD

This application generally relates to a technique of adhering an electronic component to a flexible substrate.

BACKGROUND

A display device having a flexible image display portion, such as a film liquid crystal display and a flexible organic EL display, has attracted attention from the standpoint of convenience and portability.

Such a display device uses a flexible display substrate as a main body component. The flexible display substrate has an image display region for displaying images and a mounting region for mounting an electronic component (for example, a driver IC) that processes a video signal of the image display device on a flexible substrate, such as a plastic film having flexibility and high transparency.

When the electronic component is mounted, it is common that a thermosetting anisotropic conductive film is arranged on the mounting region, the electronic component is arranged on the anisotropic conductive film, and then, the electronic component is fixed using the anisotropic conductive film by heating and pressing. It is noted that in order to further improve the flexibility of the flexible display substrate, reducing the thickness or rigidity of the plastic film serving as a substrate causes deformation or distortion of the substrate during the heating and pressing as described above, and likely leads to degradation of display images.

Wiring boards or flexible printed wiring boards, although different from that of the flexible display substrate described above, share a common feature with the flexible display substrate in that they both use a flexible substrate. In the technical field of flexible printed wiring boards, there is a technique of adhering a reinforcing plate (a backing plate) to the back surface of an external terminal region formed at the end part of the wiring board, and thus, providing a support against heat and stress applied to the end part by using the reinforcing plate on the back surface. This technique allows avoiding distortion or deformation occurring during the penetration into other components and the mounting of the electronic component on the wiring board.

Specific examples of the above-discussed reinforcing plate include a thermosetting-type reinforcing plate, such as a thermosetting sheet like those described in Patent Literatures 1 to 3, and an adhesion sheet like those described in Patent Literatures 4 and 5.

CITATION LIST

Patent Literature

Patent Literature 1: Japanese Patent Application Laid-Open No. 2012-219154
Patent Literature 2: Japanese Patent Laid-Open Publication No. 2012-116870
Patent Literature 3: Japanese Patent Laid-Open Publication No. 2011-79959
Patent Literature 4: Japanese Patent Laid-Open Publication No. 2006-332187
Patent Literature 5: Japanese Patent Laid-Open Publication No. 2006-173535

Thus, one idea is to line the back surface side of the mounting region of the flexible display substrate described above with a reinforcing plate, such as those described in Patent Literatures 1 to 5, before the mounting of the electronic component is performed.

When a thermosetting sheet like those described in Patent Literatures 1 to 3 is used as a reinforcing plate, the lining process needs to be performed at a low temperature and in a short time (at 100° C. or lower in several minutes) in order to minimize influences on a display element (for example, a liquid crystal element and an EL element) arranged in the image display region of the flexible display substrate. However, the above-discussed thermosetting sheets cause a problem in that a reaction rate is insufficient to complete the thermosetting to a sufficient level.

On the other hand, using an adhesion sheet like those described in the Patent Literatures 4 and 5 as a reinforcing plate does not cause the problem discussed above. However, when the anisotropic conductive film is arranged on the mounting region and then the electronic component, such as, an IC is heated (at 170° C. for 5 seconds) and pressed, the adhesion sheet is deformed with the heat, thereby causing a problem of lowering reliability in the mounting condition. In particular, conductive particles of the anisotropic conductive film located under the electrodes or bumps formed on the IC or the like are not sufficiently deformed, and thus, it is speculated that a sufficient pressure is not applied to the conductive particles due to deformation of the adhesion sheet upon pressing.

For measuring the problems, the amount of a curing agent may be increased in the thermosetting sheet instead of using the one described in Patent Literatures 1 to 3, so that increasing the reaction rate is considered in order to enable the low-temperature connection. However, this causes a reduction in preservation stability of the thermosetting sheet.

It is also possible to increase the glass transition temperature used in the adhesion sheet described in Patent Literatures 4 and 5. However, increasing the glass transition temperature alone is not sufficient to prevent the deformation of the adhesion sheet caused by heating and pressing of the anisotropic conductive film. Furthermore, increasing the glass transition temperature generally causes a reduction in peeling strength of the adhesion sheet.

SUMMARY

In general, increasing the reactivity of the thermosetting sheet to enable the low-temperature adhesion causes a problem in the preservation stability. Further, increasing the curing component or the like makes a cured product harder and significantly reduces peeling strength thereof required for a flexible OLED module.

On the other hand, even if the glass transmission temperature of the adhesive in the adhesion sheet is made to be higher, the adhesion sheet is still incomparable with the thermosetting-type sheet and never achieves the level capable of preventing recesses at the location under the bumps during compression bonding of the ACF.

In the disclosed embodiments, a desirable adhesion film was obtained by adding to an adhesion film having sufficient peeling strength, spherical particles having a size smaller than the thickness of the adhesive layer and hardness not to be crushed by the pressure during the compression bonding of the ACF. In this adhesion film, the peeling strength is ensured by the adhesive, while the hard spherical particles contained in the adhesive function as a pillar during the compression bonding of the ACF, so that the conductive particles are crushed instead of being pushed down under the bumps of the IC.

As a reinforcing tape of the flexible substrate, the adhesion film, while maintaining the high peeling strength, allows the conductive particles to be crushed during the compression bonding of the COP-ACF, thereby enabling an electrical connection.

In embodiments, there is provided a method for producing a flexible mounting substrate. The method comprises preparing a flexible substrate having a mounting region for mounting an electronic component on an arrangement surface of the flexible substrate, the electronic component including at least one bump, arranging a thermosetting anisotropic conductive film having conductive particles on the mounting region, arranging the electronic component on the anisotropic conductive film, pressing the electronic component while heating to electrically connect the at least one bump of the electronic component to the mounting region of the flexible substrate, and adhering an adhesion film having an adhesive layer including an adhesive and a base film laminated together on a support surface that is opposite to the arrangement surface of the flexible substrate at least at a portion on a back surface side of the mounting region before electrically connecting the electronic component and the mounting region. The adhesive layer includes spherical particles having an average particle diameter in a range of 75% to 95% of a thickness of the adhesive layer and a 10% compression pressure of at least 10 MPa.

In the adhering, the adhesion film may be arranged and adhered at a portion located on a back surface side of an image display region on the support surface.

The adhesive layer of the adhesion film may include the spherical particles in a range of 10 parts to 40 parts by volume relative to 100 parts by volume of the adhesive in the adhesive layer.

BRIEF DESCRIPTION OF DRAWINGS

FIGS. 1(a), 1(b), 1(c) and 1(d) are diagrams for explaining steps of the disclosed embodiments.

FIGS. 2(a) and 2(b) are diagrams for explaining steps of the disclosed embodiments.

FIGS. 3(a) and 3(b) are diagrams for explaining steps in a case where an adhesion film is not arranged at a portion located in a back side of an image display region on a support surface.

FIG. 4 is a cross-sectional view of a conductive particle.

DETAILED DESCRIPTION

A reference numeral 15 in FIG. 2(b) represents a flexible mounting substrate obtained by the disclosed embodiments, which is also referred to as a flexible mounting module.

The flexible mounting substrate (15) includes a flexible substrate (11) formed of materials selected by the group of a polyimide film, a polycarbonate film, a polyether sulfone film, a polyester film, or the like, an electronic component (9) that is an integrated circuit, a display device (5) having flexibility, and an adhesion film (20) as a reinforcing plate.

An image display region (16) and a mounting region (10) are arranged on an arrangement surface (7) which is one surface of the flexible substrate (11) formed of the polyimide or the polyester film. The display device (5) is arranged on the image display region (16) and the electronic component (9) is arranged on the mounting region (10). The electronic component (9) and the display device (5) are electrically connected by a patterned wiring film (not shown), so that electric circuits including the electronic component (9) output an electrical signal to the display device (5) to allow the display device (5) to display characters, video images, and the like.

The display device (5) has flexibility and is bendable together with the flexible substrate (11).

The adhesion film (20) includes a flexible base film (22), such as, a polyester film, an OPP film, a PE film, a PVA film, or a PVC film, and a flexible adhesive layer (21) arranged on the base film (22).

A reference numeral 8 represents a support surface that is a surface opposite to the arrangement surface (7) of the flexible substrate (11). The adhesion film (20) is adhered on the support surface (8) at a portion located right in the back surface of the mounting region (10) with the adhesive layer (21) being in contact with the support surface (8).

The adhesion film (20) is also adhered on the support surface (8) at a portion located right in the back surface of the image display region (16) in addition to the portion located right in the back surface of the mounting region (10). In this configuration, a part of one sheet of the adhesion film (20) is located right behind the mounting region (10) and the other part of the adhesion sheet (20) is located right behind the image display region (16).

The adhesive layer (21) includes an adhesive (26) made of a non-thermosetting resin, and spherical particles (25) dispersed in the adhesive (26).

The non-thermosetting resin can be selected from resins having a sufficient peeling strength as an adhesive and a glass transition temperature in a range of −60° C. to 20° C. so that deformation of the resin is relatively small at a high temperature (about 160° C.) reached during the heating and pressing of the anisotropic conductive film.

Specifically, the non-thermosetting resin used can be selected from a rubber-based polymer, such as a nitrile rubber (NBR: a copolymer of acrylonitrile and 1,3-butadiene), a butyl rubber, and an ethylene-propylene rubber, and an acrylic polymer used in a common adhesive, depending on a material of the flexible substrate (11).

The procedures for mounting the electronic component (9) on the flexible substrate (11) will be described below.

In the flexible substrate (11) shown in FIG. 1(a), the display device (5) is arranged on the image display region (16), but the electronic component (9) is not mounted yet. In this state of the flexible substrate (11), surfaces of a patterned thin metal film and electrodes (6) made of ITO, IZO, or the like are exposed in the mounting region (10) of the arrangement surface (7).

As shown in FIG. 1(b), the adhesive layer (21) of the adhesion film (20) is brought into contact with the support surface (8) of the flexible substrate (11) at least at a portion located right in the back surface of the mounting region (10).

In this configuration, one sheet of the adhesion film (20) is sized so that one part of the adhesion film (20) is located right behind the mounting region (10) and the other part of the adhesion film (20) is located right behind the image display region (16). As a result, the support surface (8) located right behind the image display region (16) is also in contact with the adhesive layer (21).

Next, either or both of the adhesion film (20) and the flexible substrate (11) are pressed in the direction of approaching each other, while the adhesion film (20) is heated to a first adhering temperature to adhere the adhesion film (20) to the flexible substrate (11) as shown in FIG. 1(b). The adhesion film (20) is adhered to the flexible substrate (11) at the portion located right in the back surface of the mounting region (10) and at the portion located right in the back surface of the image display region (16).

Since the adhesive of the adhesive layer (21) is not a thermosetting resin, the first adhering temperature in the adhering step is close to room temperature and thus, the first adhering temperature is lower than the temperature at which the flexible substrate (11) is deformed.

Next, as shown in FIG. 1(c), an anisotropic conductive film (12) of which conductive particles (19) are dispersed in a thermosetting resin composition formed of an epoxy resin, an acrylic resin, or the like, is arranged on the electrodes (6) so as to be in contact with the surface of the electrodes (6).

Then, as shown in FIG. 1(d), the electronic component (9) is placed on the anisotropic conductive film (12).

The electronic component (9) is provided with bumps (13) that are electrically connected to semiconductor chips on a bottom surface of an element main body (14) incorporating the semiconductor chips. In this configuration, when the electronic component (9) is arranged on the mounting region (10) in a manner such that the bumps (13) face toward the flexible substrate (11), the electrodes (6) are located between the bumps (13) and the arrangement surface (7). The height of the bumps (13) is in a range of at least 10 μm and at most 100 μm.

The flexible substrate (11) to which the adhesion film (20) is adhered is arranged on a table (30) so that the support surface (8) of the flexible substrate (11) and the base film (22) of the adhesion film (20) are brought into contact with the surface of the table (30). After arranging the electronic component (9) on the anisotropic conductive film (12) in a manner such that the bumps (13) are located on the electrodes (6), a pressing member (31) is brought into contact with the surface of the element main body (14) of the electronic component (9) so as to press the electronic component (9) by the pressing member (31) as shown in FIG. 2(a).

A heating device is provided inside the pressing member (31) to heat the pressing member (31) to a predetermined temperature. The electronic component (9), which is in contact with and pressed by the pressing member (31) to press is heated by heat conduction to increase its temperature.

The anisotropic conductive film (12) being in contact with the bumps (13) is pressed down by the bumps (13) when the electronic component (9) is pressed down. The anisotropic conductive film (12), the electrodes (6), the flexible substrate (11), and the adhesion film (20) are aligned in a straight line between a part where the bumps (13) and the anisotropic conductive film (12) are in contact with each other and the table (30). In this configuration, the electronic component (9) and the bumps (13) are pressed to the table (30) which is stationary. The electrodes (6), the flexible substrate (11), and the adhesion film (20) are also pressed to each other. Further, when the temperature of the electronic component (9) is increased by the heating, the anisotropic conductive film (12), the electrodes (6), the flexible substrate (11), and the adhesion film (20) are also heated by the heat conduction from the electronic component (9), and their temperatures are increased.

When the adhesive layer (21) of the adhesion film (20) is under pressure, the adhesive (26) in the adhesive layer (21) is also heated and its temperature increases. As a result, the adhesive (26) is softened and becomes easily deformed.

A material of resin particles of the conductive particles (19) used in the anisotropic conductive film (12) may be appropriately selected from an epoxy resin, a phenol resin, an acrylic resin, an acrylonitrile-styrene (AS) resin, a benzoguanamine resin, a divinylbenzene-based resin, a styrene-based resin, and the like, depending on the characteristics of the thermosetting adhesive.

When the electronic component (9) is pressed toward the table (30), the bumps (13) are brought into contact with the conductive particles (19) and the conductive particles (19) are pressed by the bumps (13) against the electrodes (6).

During this process, the adhesive layer (21) is strongly pressed at a position directly under a part of the electrodes (6) where the conductive particles (19) are pressed, and thus, the adhesive (26) at a position of the adhesive layer (21) is more largely deformed than the adhesive layer (19) at an area surrounding the position. As a result, recessed parts recessed further than their surroundings are generated in the adhesive layer (21) and the electrodes (6) located on the adhesive layer. Once the conductive particles (19) fall into the recessed parts of the electrodes (6), it becomes difficult to strongly press the conductive particles (19).

However, in the disclosed embodiments, the adhesive layer (21) contains spherical particles (25) having a diameter smaller than the film thickness (the thickness) of the adhesive layer (21). In this example, the diameter of the spherical particles (25) is set to at least 75% and at most 95% of the film thickness of the adhesive layer (21) before being pressed.

Since the diameter of the spherical particles (25) is smaller than the film thickness of the adhesive layer (21), the single spherical particle (25) is unable to simultaneously be in contact with both the base film (22) and the flexible substrate (11) before the electronic component (9) is pressed. After the adhesive (26) is pressed and pushed out from between the flexible substrate (11) and the base film (22), the film thickness of the adhesive layer (21) is reduced, and the base film (22) and the flexible substrate (11) are moved relatively in the direction of approaching each other. When the film thickness of the adhesive layer (21) is reduced to the same length as the diameter of the spherical particles (25), the spherical particles (25) are in contact with both the base film (22) and the flexible substrate (11).

The spherical particles (25) comprise a material having a 10% compression pressure of at least 10 MPa. For example, a hard material, such as a hard resin, glass, metal, or ceramic may be molded into the spherical shape to produce the spherical particles (25).

Because the spherical particles (25) are not deformed by pressing, the film thickness of the adhesive layer (21) is maintained at the size of the diameter of the spherical particles (25) at a part where the spherical particles (25) are present and its surroundings when the adhesive layer (21) is pressed.

FIG. 4 shows a cross-sectional view of the conductive particle (19). A thin metal film (32) is formed on the surface of a resin particle (30), and an insulation layer (33) is formed on the surface of the thin metal film (32).

When the spherical particles (25) are located at a position directly under the part of the electrodes (6) where the conductive particles (19) are pressed by the bumps (13), or its surroundings, the conductive particles (19) are pressed by the bumps (13) against the electrodes (6) without generating recessed parts in the adhesive layer (21) and the electrodes (6). At that time, the resin particles (30) arranged at the center of the conductive particles (19) are thus deformed by pressing, leading to crushing of the conductive particles (19), the breakdown of the insulation layers (33), and the exposure of the thin metal films (32). The exposed thin metal films (32) are brought into contact with the bumps (13) and the electrodes (6). As a result, the bumps (13) and the electrodes (6) are electrically connected by the crushed conductive particles (19).

In essence, the electronic component (9) is heated and pressed by the pressing member (31) located on the electronic component (9), and the distance between the flexible substrate (11) and the base film (22) becomes closer as the adhesive layer (21) is heated and pressed, the spherical particles (25) are in contact with both the flexible substrate (11) and the base film (22), and the distance is not shorter than the diameter of the spherical particles (25). The conductive particles located between the bumps and the electrodes are pressed by the bumps and the electrodes, then, the conductive particles (19) located between the bumps (13) and the electrodes (6) are deformed, and thus, the flexible mounting substrate (15) having a reliable electronic connection between the bumps (13) and the electrodes (6) can be obtained (FIG. 2(f)).

It is noted that an area of the adhesive layer (21) where the spherical particles (25) are absent is not largely recessed as long as the spherical particles (25) are present nearby. Thus, the amount (the number/volume) of the spherical particles (25) contained in the adhesive layer (21) is adjusted to the level with which large recesses are prevented in the entire region of the adhesive layer (21).

EXAMPLES

Acrylic particles having an average diameter of 15 μm or glass balloons having an average diameter of 15 μm were dispersed as the spherical particles (25) in an adhesive (26) made of an acrylic resin so as to prepare two kinds of adhesive layers (21) each having a thickness of 18 μm. The adhesive layers (21) are separately formed on the base films (22) to obtain the adhesion films (20) (Example 1 and Example 2).

For comparison, an adhesive layer (21) including the same adhesive (26) as in Examples 1 and 2 without the spherical particles (25) were prepared to obtain the adhesive film (Comparative Example 1), and then, the adhesive layers containing the same adhesive (26) as in Examples 1 and 2, in which urethane particles having an average diameter of 15 μm or acrylic particles having an average diameter of 6 μm were dispersed as the spherical particles (25) were formed on the base films to obtain the adhesion films (Comparative Example 2 and Comparative Example 3).

The spherical particles (25) used in the adhesion films of Examples 1 and 2 and Comparative Examples 1 to 3 were subjected to the following measurements: the amount of the spherical particles (25) contained in 100 parts by volume of the adhesive (26); the pressure (10% compression strength) which causes 10% deformation to the single spherical particle (25) when each spherical particle (25) is pressed and deformed; the force (N) required for peeling a 2 cm-wide adhesive layer (21) from a test plate, to which the adhesive layer had been adhered, at an angle of 180°; and the occurrence of a recess at a position directly under the bumps (13) upon heating and pressing the electronic component (9). The results are shown in Table 1 below.

TABLE 1

| | Measurement results | | | | |
| --- | --- | --- | --- | --- | --- |
| | Example 1 ϕ 15 Acrylic particle | Example 2 ϕ 15 Glass balloon | Comparative example 1 Adhesive only | Comparative example 2 ϕ 15 Urethan particle | Comparative example 3 ϕ 6 Acrylic particle |
| Spherical particle diameter (average) | 15 μm | 15 μm | — | 15 μm | 6 μm |
| Ratio(%) of spherical particle and thickness of adhesive layer | 83 | 83 | — | 83 | 33 |
| Amount of spherical particles (parts by volume) | 10 | 10 | 0 | 10 | 10 |
| 10% compression strength (Mpa) | 10 | 69 pessure-resistance strength | — | 1 | 15 |
| 180 angular degree peeling strength (N/2 cm) | 11.1 | 10.3 | 11.3 | 11.8 | 10.1 |
| Recess under bump during compression bonding of ACF | ○ | ○ | X | X | Δ |
| Results | Good | Good | Poor | Poor | Poor |

*Thichness of adhesive: 18 μm
*Adhesive: 100 parts by volume

Further, in this example, the spherical particles (25) are contained in the adhesive layer (21) in a range of at least 10 vol. % (=A×0.1) and at most 40 vol. % (=A×0.4) relative to the volume A of the adhesive (26). Thus, even if the adhesive layer (21) is partially recessed, for example, the depth of the recess is still smaller than the diameter of the conductive particles (19), thereby allowing the conductive particles (19) to be crushed by pressing.

It is noted that the flexible substrate (11) or the base film (22) itself is partially recessed by the heating and pressing, however the degree of the recess is negligibly small.

In the table, the column "RECESS UNDER BUMP" was provided with "○ (circle)" if no recess was observed, "Δ (triangle)" if a small recess was observed, and "× (cross)" if a large recess was observed. If the column "RECESS UNDER BUMP" was provided with "circle," the spherical particles were qualified for practical use, thus the column "RESULTS" was provided with "Good." If "triangle" or "cross" was provided in "RECESS UNDER BUMP," the spherical particles might cause an electrical connection failure and not be suitable for practical use, thus "Poor" was provided in "RESULTS."

When the spherical particles (25) are largely deformed at the time of heating and pressing the electronic component (9), it becomes difficult to sufficiently crush the conductive particles (19). Thus, the compression strength causing 10% deformation to the spherical particle (25) is required to be at least 10 MPa.

It is noted that the film thickness of the adhesive layer (21) is generally set in a range of at least 10 μm and at most 150 μm. When the spherical particles (25) contained in the adhesive (26) are too large compared to the film thickness of the adhesive layer (21), the adhesion force of the adhesive layer (21) decreases. When it becomes too small, the "RECESS UNDER BUMP" occurs. Thus, the diameter of the spherical particles (25) is required to be smaller than the film thickness of the adhesive layer (21), in particular, the average diameter of the spherical particles (25) is required to be in a range of at least 75% and at most 95% of the film thickness of the adhesive layer (21).

Further, if the content of the spherical particles (25) is excessive, the adhesion force decreases, while if it is insufficient, the "RECESS UNDER BUMP" occurs. Thus, it is preferred that the spherical particles (25) are contained in an amount of at least 10 parts by volume relative to 100 parts by volume of the adhesive (26).

It is noted that the base film (22) may be a film comprising a flexible resin or a thin plate comprising a hard resin having no flexibility.

It is noted that FIGS. 3(*a*) and (*b*) show a flexible mounting substrate (15') obtained by adhering the adhesion film (20) on the support surface (8) of the flexible substrate (11) in such a state that a part of the adhesion film (20) is located right behind the mounting region (10), while any part of the adhesion film (20) is not located right behind the image display region (16). The flexible film (15') shown in FIG. 3(*a*) is bent on the table (3) due to the weight of the display device (5). After completion of the mounting of the electronic component (9), the bending of the flexible substrate (11) can be eliminated and the flexible substrate (11) can have a flattened-shape after the flexible film (15') is moved from the table (30) as shown in FIG. 3(*b*).

The disclosed embodiments also encompass a method for producing such a flexible mounting substrate in which the adhesive layer (21) is not adhered to the support surface (8) right behind the image display region (16).

What is claimed is:

1. A method for producing a flexible mounting substrate, the method comprising:
   preparing a flexible substrate having a mounting region for mounting an electronic component on an arrangement surface of the flexible substrate, the electronic component including at least one bump; arranging a thermosetting anisotropic conductive film having conductive particles on the mounting region;
   arranging the electronic component on the anisotropic conductive film;
   adhering an adhesion film on a support surface of the flexible substrate, and then
   pressing the electronic component while heating to electrically connect the at least one bump of the electronic component to the mounting region of the flexible substrate,
   wherein the adhesion film includes an adhesive layer and a base film laminated together, the adhesive layer is positioned on the support surface that is a back surface side of the mounting region and opposite to the arrangement surface of the flexible substrate, and
   the adhesive layer includes spherical particles having an average particle diameter in a range of 75% to 95% of a thickness of the adhesive layer and a 10% compression pressure of at least 10 MPa.

2. The method for producing a flexible mounting substrate according to claim 1, wherein in the adhering, the adhesion film is arranged and adhered at a portion located on a back surface side of an image display region on the support surface.

3. The method for producing a flexible mounting substrate according to claim 2, wherein the adhesive layer of the adhesion film includes the spherical particles in a range of 10 parts to 40 parts by volume relative to 100 parts by volume of the adhesive in the adhesive layer.

4. The method for producing a flexible mounting substrate according to claim 1, wherein the adhesive layer of the adhesion film includes the spherical particles in a range of 10 parts to 40 parts by volume relative to 100 parts by volume of the adhesive in the adhesive layer.

\* \* \* \* \*